United States Patent
Tanaka

(10) Patent No.: US 11,460,483 B2
(45) Date of Patent: Oct. 4, 2022

(54) INERTIAL SENSOR, ELECTRONIC INSTRUMENT, AND VEHICLE

(71) Applicant: Seiko Epson Corporation, Tokyo (JP)

(72) Inventor: Satoru Tanaka, Chino (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 16/911,444

(22) Filed: Jun. 25, 2020

(65) Prior Publication Data
US 2020/0408802 A1 Dec. 31, 2020

(30) Foreign Application Priority Data
Jun. 26, 2019 (JP) .............................. JP2019-118387

(51) Int. Cl.
*G01P 15/125* (2006.01)
*B81B 3/00* (2006.01)
*G01P 15/08* (2006.01)

(52) U.S. Cl.
CPC .......... *G01P 15/125* (2013.01); *B81B 3/0008* (2013.01); *G01P 2015/084* (2013.01); *G01P 2015/0831* (2013.01)

(58) Field of Classification Search
CPC .... G01P 15/125; G01P 15/0802; G01P 15/08; G01P 15/18; G01P 2015/084; G01P 2015/0831; G01P 2015/0871; B81B 3/0002; B81B 3/0005; B81B 3/0008; B81B 3/001
See application file for complete search history.

(56) References Cited

U.S. PATENT DOCUMENTS

| | | | |
|---|---|---|---|
| 8,079,262 B2* | 12/2011 | Guo | G01P 15/125 73/514.32 |
| 9,880,192 B2 | 1/2018 | Cheng et al. | |
| 2006/0169043 A1* | 8/2006 | McNeil | G01P 15/125 73/514.01 |
| 2008/0173959 A1* | 7/2008 | Merassi | B81B 3/0051 73/514.24 |
| 2010/0242600 A1 | 9/2010 | Lin et al. | |
| 2012/0120872 A1 | 5/2012 | Korhonen et al. | |
| 2013/0042684 A1* | 2/2013 | Yoda | G01P 15/125 73/514.01 |

(Continued)

FOREIGN PATENT DOCUMENTS

| | | |
|---|---|---|
| JP | 2008-529001 A | 7/2008 |
| JP | 2012-521565 A | 9/2012 |

(Continued)

*Primary Examiner* — Helen C Kwok
(74) *Attorney, Agent, or Firm* — Harness, Dickey & Pierce, P.L.C.

(57) ABSTRACT

An inertial sensor includes a substrate, a movable element that swings around a swing axis; and a protrusion that overlaps with the movable element in the plan view and protrudes from the substrate toward the movable element. The protrusion includes a first protrusion and a second protrusion so located as to be farther from the swing axis than the first protrusion, and when the movable element swings relative to the substrate around the swing axis, the first protrusion and the second protrusion come into contact with the movable element at the same time or the first protrusion comes into contact with the movable element and then the second protrusion comes into contact with the movable element.

9 Claims, 14 Drawing Sheets

(56) References Cited

U.S. PATENT DOCUMENTS

| | | | | |
|---|---|---|---|---|
| 2014/0338451 | A1* | 11/2014 | Takagi | B81B 3/0008 |
| | | | | 73/514.32 |
| 2015/0040667 | A1* | 2/2015 | Tanaka | G01P 15/125 |
| | | | | 73/514.32 |
| 2016/0257559 | A1* | 9/2016 | Chuang | G01P 15/0802 |
| 2017/0088413 | A1* | 3/2017 | Tanaka | B81B 3/001 |
| 2018/0273375 | A1* | 9/2018 | Tanaka | B81C 1/00166 |
| 2019/0025338 | A1* | 1/2019 | Matsuura | H01L 29/84 |
| 2019/0063924 | A1* | 2/2019 | Tanaka | G01C 19/5769 |
| 2019/0064202 | A1* | 2/2019 | Tanaka | G01C 19/5705 |
| 2019/0120872 | A1* | 4/2019 | Geisberger | G01P 15/125 |

FOREIGN PATENT DOCUMENTS

| | | |
|---|---|---|
| JP | 2012-220376 A | 11/2012 |
| JP | 2015-031644 A | 2/2015 |
| JP | 6146565 B2 | 6/2017 |

* cited by examiner

INERTIAL SENSOR, ELECTRONIC INSTRUMENT, AND VEHICLE

The present application is based on, and claims priority from JP Application Serial Number 2019-118387, filed Jun. 26, 2019, the disclosure of which is hereby incorporated by reference herein in its entirety.

BACKGROUND

1. Technical Field

The present disclosure relates to an inertial sensor, an electronic instrument, and a vehicle.

2. Related Art

For example, an inertial sensor described in JP-A-2015-031644 is a sensor capable of detecting acceleration in an axis-Z direction and includes a substrate, a movable element that performs seesaw swing relative to the substrate around a swing axis extending along an axis-Y direction, and a detection electrode provided on the substrate. The movable element includes a first movable section and a second movable section that are so provided as to sandwich the swing axis and differ in rotational moment around the swing axis from each other. The detection electrode includes a first detection electrode so disposed on the substrate as to face the first movable section and a second detection electrode so disposed on the substrate as to face the second movable section.

When acceleration in the axis-Z direction acts on the inertial sensor having the configuration described above, the movable element performs the seesaw swing around the swing axis, and the capacitance between the first movable section and the first detection electrode and the capacitance between the second movable section and the second detection electrode change accordingly in opposite phases. The acceleration in the axis-Z direction can therefore be detected based on the changes in the capacitance.

The inertial sensor described in JP-A-2015-031644 further includes a stopper provided on the substrate. When the movable element performs excessive seesaw swing, the stopper comes into contact with the movable element to restrict any further displacement of the movable element. The stopper includes a first stopper and a second stopper, and the second stopper is located in a position farther from the swing axis than the first stopper.

In the inertial sensor described in JP-A-2015-031644, however, the first stopper and the second stopper have the same height. Therefore, the movable element, when it performs excessive seesaw swing, first comes into contact with the second stopper, which is farther from the swing axis, is bent by the impact exerted by the contact toward the substrate, and comes into contact with the first stopper, which is closer to the swing axis. When the movable element first comes into contact with the second stopper, which is farther from the swing axis, as described above, the impact at the time of the contact is likely to be too large, and the impact is likely to break the movable element and the substrate.

SUMMARY

An inertial sensor described in an embodiment includes, provided that axes X, Y, and Z are three axes perpendicular to one another, a substrate, a movable element that swings around a swing axis extending along the axis Y, and a protrusion that overlaps with the movable element in a plan view along the axis-Z direction and protrudes from the substrate toward the movable element. The protrusion includes a proximal protrusion and a distal protrusion so located as to be farther from the swing axis than the proximal protrusion. When the movable element swings relative to the substrate around the swing axis, the proximal protrusion and the distal protrusion come into contact with the movable element at the same time or the proximal protrusion comes into contact with the movable element and then the distal protrusion comes into contact with the movable element.

DESCRIPTION OF EXEMPLARY EMBODIMENTS

An inertial sensor, an electronic instrument, and a vehicle according to the present disclosure will be described below in detail based on embodiments shown in the accompanying drawings.

First Embodiment

Figure 1:
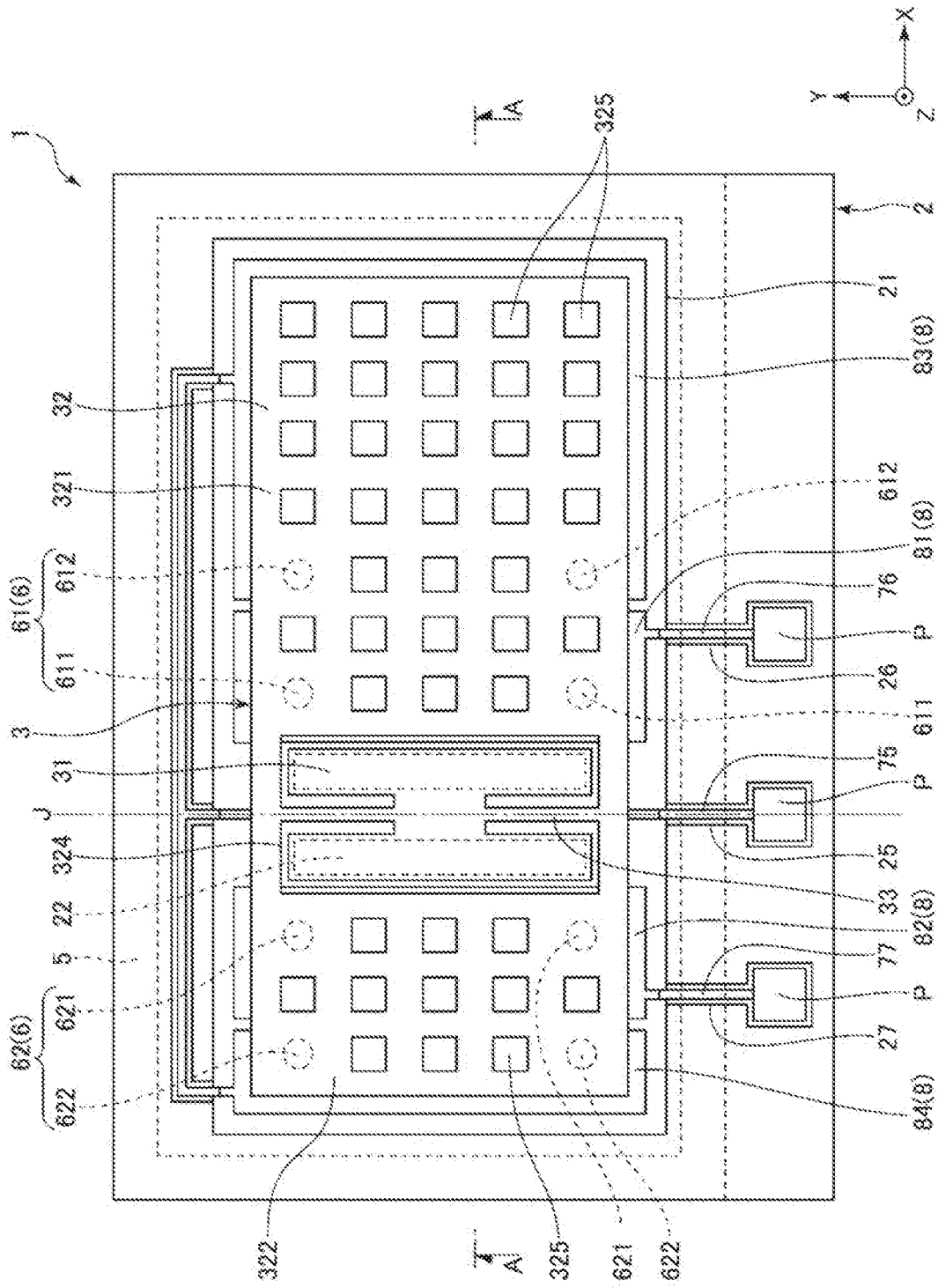
FIG. 1 is a plan view showing an inertial sensor according to a first embodiment.
Figure 2:
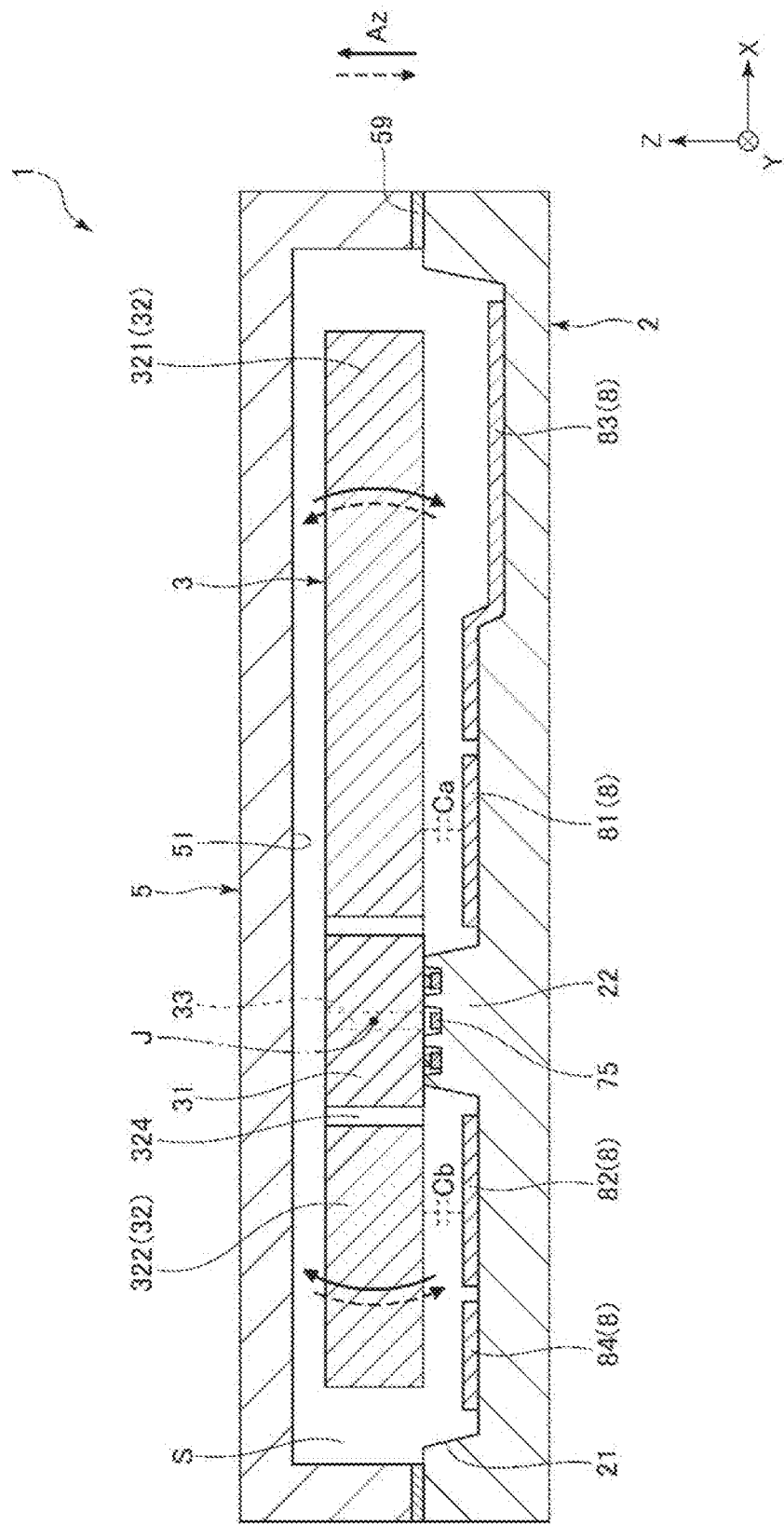
FIG. 2 is a cross-sectional view of the inertial sensor taken along the line A-A in FIG. 1.
Figure 3:
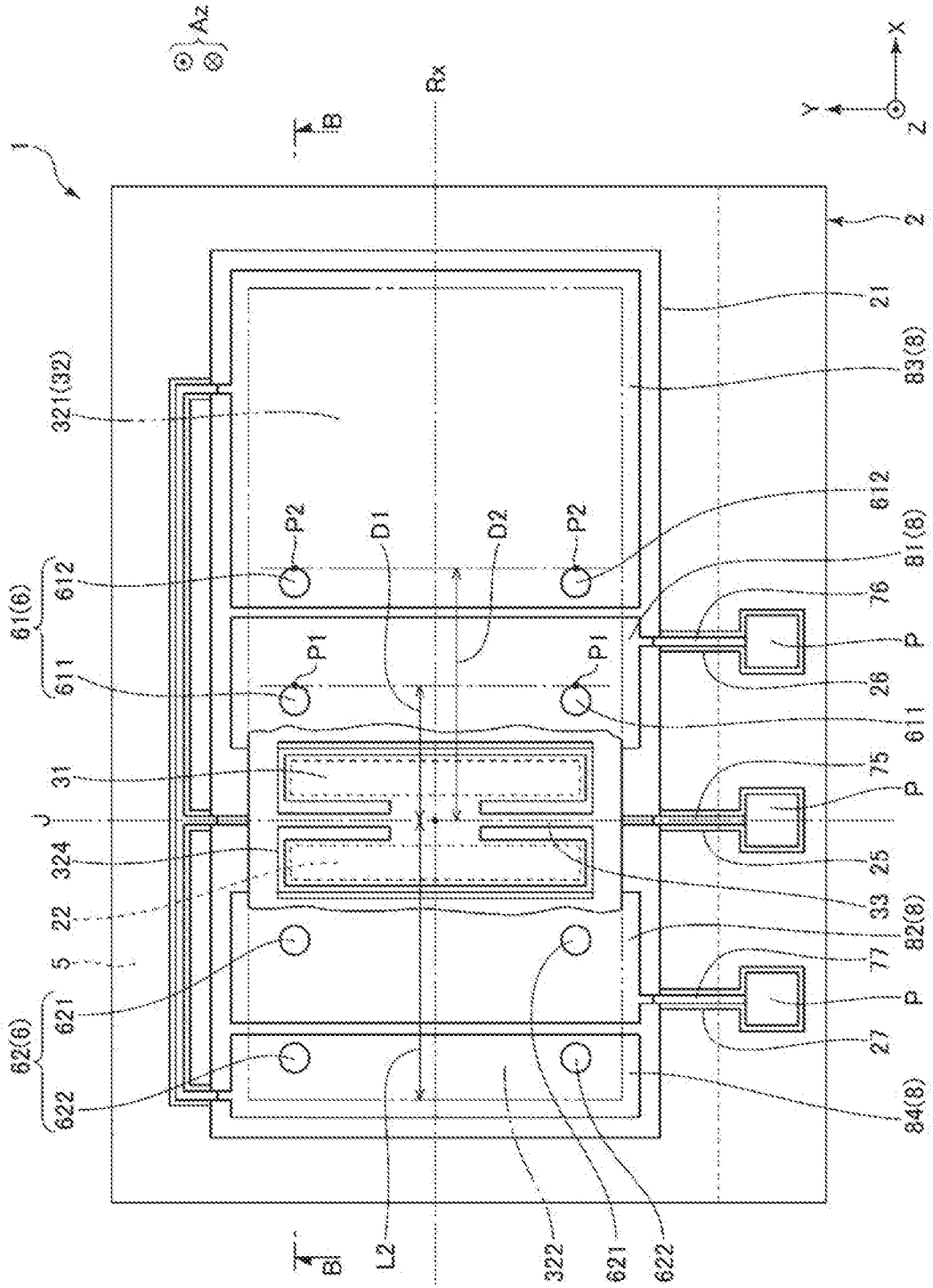
FIG. 3 is a plan view showing protrusions with which the inertial sensor is provided.
Figure 4:
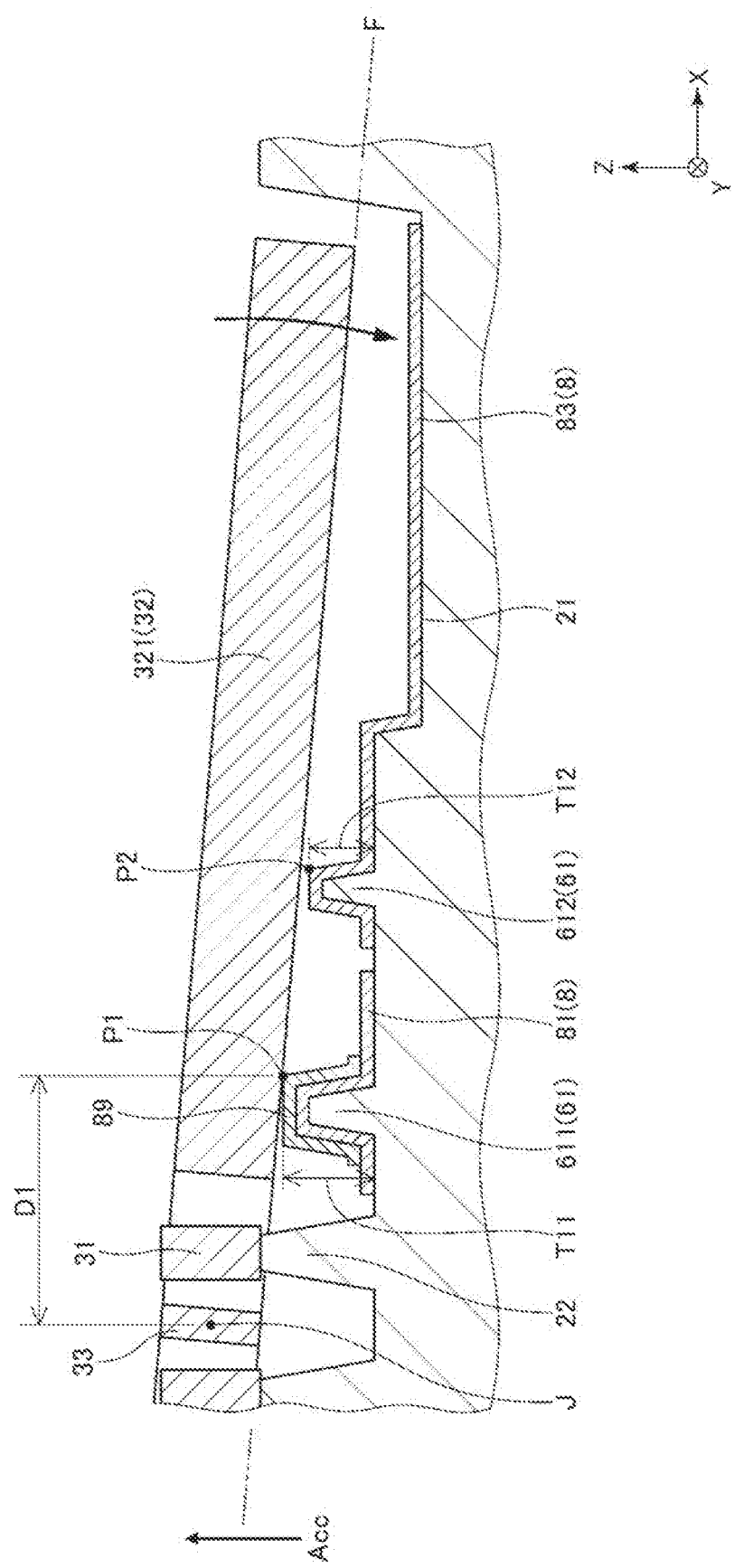
FIG. 4 is a cross-sectional view of the protrusions taken along the line B-B in FIG. 3 and describes the function of the protrusions.
Figure 5:
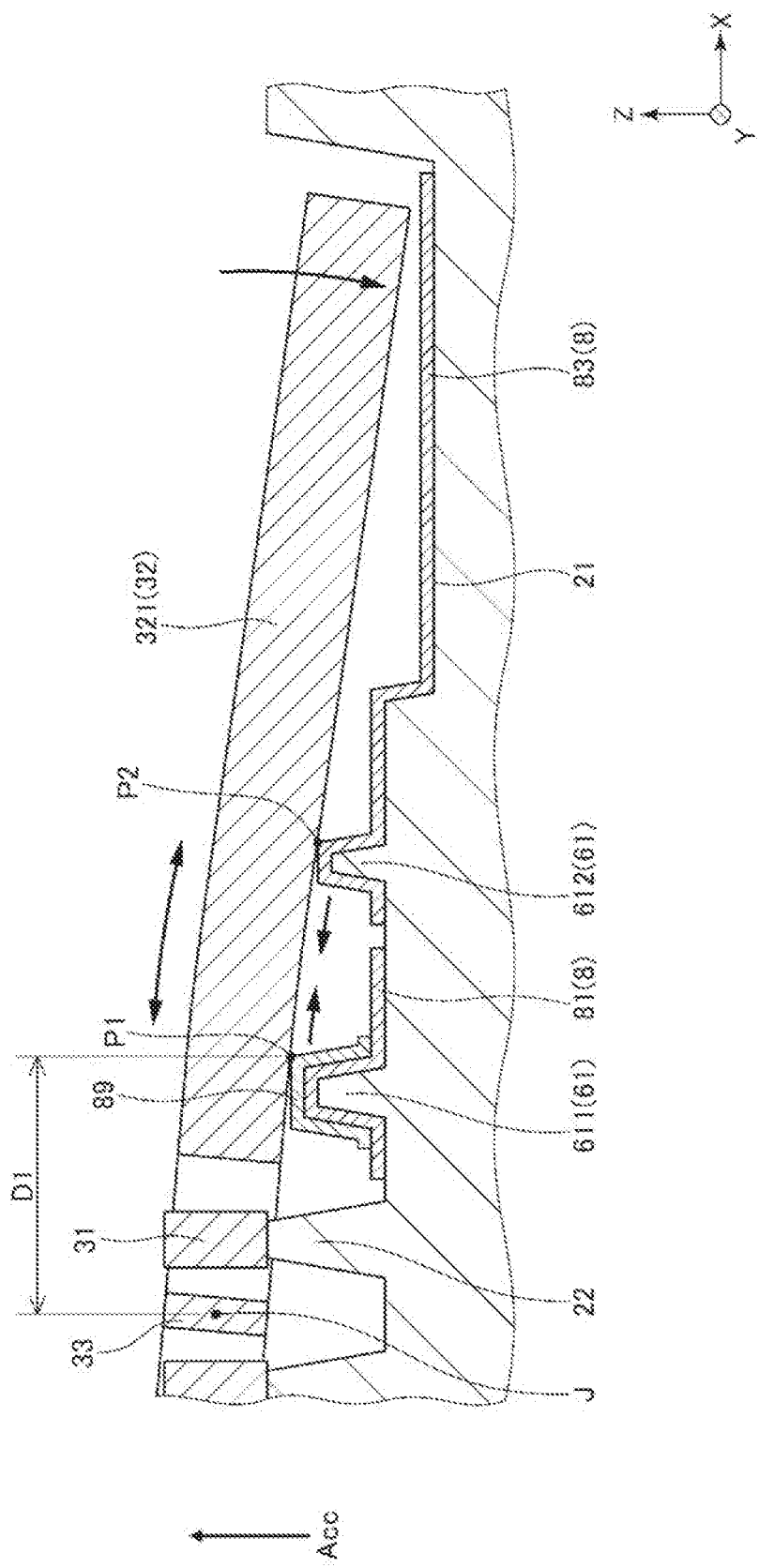
FIG. 5 is a cross-sectional view of the protrusions taken along the line B-B in FIG. 3 and describes the function of the protrusions.

FIG. 1 is a plan view showing an inertial sensor according to a first embodiment. FIG. 2 is a cross-sectional view of the inertial sensor taken along the line A-A in FIG. 1. FIG. 3 is a plan view showing protrusions with which the inertial sensor is provided. FIGS. 4 and 5 are each a cross-sectional view of the protrusions taken along the line B-B in FIG. 3 and describe the function of the protrusions.

In the following description, three axes perpendicular to one another, axes X, Y, and Z are drawn for convenience of the description. The direction along the axis X, that is, the direction parallel to the axis X is also called an "axis-X direction," the direction along the axis Y, that is, the direction parallel to the axis Y is also called an "axis-Y direction," and the direction along the axis Z, that is, the direction parallel to the axis Z is also called an "axis-Z direction." The side facing the front end of the arrow of each of the axes is also called a "positive side," and the side opposite the positive side is also called a "negative side." The positive side of the axis-Z direction is also called "upper," and the negative side of the axis-Z direction is also called "lower." In the specification of the present application, the state expressed by the term "perpendicular" includes a state comparable to "perpendicular" in a technical common sense, specifically, a state in which two lines intersect each other at 90° and also a state in which two lines intersect each other at an angle that slightly deviates from 90°, for example, an angle that falls within 90°± about 5°. Similarly, the state expressed by the term "parallel" includes a state comparable to "parallel" in a technical common sense, specifically, a state in which the angle between two lines is 0° and also a state in which the angle between two lines deviates from 0° by about ±5°.

An inertial sensor 1 shown in FIG. 1 is an acceleration sensor that detects acceleration Az in the axis-Z direction. The inertial sensor 1 includes a substrate 2, a sensor device 3, which is disposed on the substrate 2, and a lid 5, which is bonded to the substrate 2 and covers the sensor device 3.

The substrate 2 has a recess 21, which opens toward the upper side, as shown in FIG. 1. In the plan view along the axis-Z direction, the recess 21 is so formed as to accommodate the sensor device 3 and to be larger than the sensor device 3. The substrate 2 includes a mount 22, which protrudes from the bottom surface of the recess 21, as shown in FIG. 2. The sensor device 3 is bonded to the upper surface of the mount 22. The substrate 2 has grooves 25, 26, and 27, which open via the upper surface of the substrate 2, as shown in FIG. 1.

The substrate 2 can, for example, be a glass substrate made of a glass material containing an alkali metal ion that is a movable ion, such as Na$^+$, for example, borosilicate glass, such as Pyrex glass and Tempax glass (both are registered trademark). The substrate 2 is, however, not necessarily a specific substrate and may instead, for example, be a silicon substrate or a ceramic substrate.

The substrate 2 is provided with an electrode 8, as shown in FIG. 1. The electrode 8 includes a first detection electrode 81, a second detection electrode 82, a first dummy electrode 83, and a second dummy electrode 84, which are disposed on the bottom surface of the recess 21 and overlap with the sensor device 3 in the plan view. The substrate 2 further includes wiring lines 75, 76, and 77 disposed in the grooves 25, 26, and 27, respectively.

One end portion of each of the wiring lines 75, 76, and 77 functions as an electrode pad P, which is exposed to the region out of the lid 5 and electrically coupled to an external apparatus. The wiring line 75 is electrically coupled to the sensor device 3 and the first and second dummy electrodes 83, 84. That is, the first and second dummy electrodes 83, 84 have the same potential as that at a movable element 32. The wiring line 76 is electrically coupled to the first detection electrode 81, and the wiring line 77 is electrically coupled to the second detection electrode 82.

The lid 5 has a recess 51, which opens via the lower surface of the lid 5, as shown in FIG. 2. The lid 5 is so bonded to the upper surface of the substrate 2 as to accommodate the sensor device 3 in the recess 51. The lid 5 and the substrate 2 form an internal accommodation space S, which accommodates the sensor device 3. It is preferable that the accommodation space S is a hermetically sealed space and is filled with an inert gas, such as nitrogen, helium, and argon, and that the pressure of the inert gas that fills the accommodation space S is substantially equal to the atmospheric pressure at the temperature at which the inertial sensor 1 is used (from about −40° C. to 125° C.). It is, however, noted that the accommodation space S does not necessarily have a specific atmosphere and may be, for example, under pressure higher or lower than the atmospheric pressure.

The lid 5 can, for example, be a silicon substrate. It is, however, noted that the lid 5 is not necessarily formed of a specific substrate and may, for example, be a glass substrate or a ceramic substrate. The method for bonding the substrate 2 and the lid 5 to each other is not limited to a specific method and may be selected as appropriate in accordance with the materials of the substrate 2 and the lid 5. For example, the method can be anodic bonding, activation bonding in which bonding surfaces activated by plasma radiation are bonded to each other, bonding using a bonding material, such as glass frit, and diffusion bonding in which a metal film deposited on the upper surface of the substrate 2 and a metal film deposited on the lower surface of the lid 5 are bonded to each other. In the present embodiment, the substrate 2 and the lid 5 are bonded to each other with glass frit 59, which is made of low-melting-point glass.

The sensor device 3 is formed, for example, by etching an electrically conductive silicon substrate into which an impurity, such as phosphorus (P), boron (B), and arsenic (As), has been doped, particularly, patterning the silicon substrate in a Bosch process, which is a deep-groove etching technology. The sensor device 3 includes an H-shaped fixed section 31, which is bonded to the upper surface of the mount 22, the movable element 32, which is swingable relative to the fixed section 31 around a swing axis J extending along the axis Y, and swing beams 33, which connect the fixed section 31 to the movable element 32, as shown in FIG. 1. The fixed section 31 is bonded to the mount 22, for example, in anodic bonding.

The movable element 32 has an oblong shape having a longitudinal direction that coincides with the axis-X direction in the plan view along the axis-Z direction. The movable element 32 includes a first movable section 321 and a second movable section 322 so disposed as to sandwich the swing axis J extending along the axis Y in the plan view along the axis-Z direction. The first movable section 321 is located on the positive side of the swing axis J in the axis-X direction, and the second movable section 322 is located on the negative side of the swing axis J in the axis-X direction. The first movable section 321 is longer than the second movable section 322 in the axis-X direction, and the rotational moment of the first movable section 321 around the swing axis J produced when the acceleration Az acts on the inertial sensor 1 is greater than that of the second movable section 322.

The difference in the rotational moment causes the movable element 32 to perform seesaw swing around the swing axis J when the acceleration Az acts on the inertial sensor 1. The seesaw swing means that displacement of the first movable section 321 toward the positive side of the axis-Z direction causes displacement of the second movable section 322 toward the negative side of the axis-Z direction, and that conversely, displacement of the first movable section 321 toward the negative side of the axis-Z direction causes displacement of the second movable section 322 toward the positive side of the axis-Z direction.

The movable element 32 has an opening 324 located between the first movable section 321 and the second movable section 322. The fixed section 31 and the swing beams 33 are disposed in the opening 324. Since the fixed section and the swing beams 33 are thus disposed inside the movable element 32, the size of the sensor device 3 can be reduced. The movable element 32 has a plurality of through holes 325 uniformly formed across the movable element 32. The through holes 325 can reduce damping due to viscosity of the material of which the movable element 32 is made. It is, however, noted that the through holes 325 may be omitted, may not be uniformly arranged, or may not be disposed across the movable element 32 but may be disposed in part of the movable element 32.

Now, return to the description of the electrode 8 disposed on the bottom surface of the recess 21. In the plan view along the axis-Z direction, the first detection electrode 81 is so disposed as to overlap with a base portion of the first movable section 321, and the second detection electrode 82 is so disposed as to overlap with a base portion of the second movable section 322, as shown in FIGS. 1 and 2. The first and second detection electrodes 81, 82 are provided symmetrically with respect to the swing axis J in the plan view along the axis-Z direction.

The first dummy electrode 83 is located on the positive side of the first detection electrode 81 in the axis-X direction and so disposed as to overlap with a front end portion of the first movable section 321, and the second dummy electrode 84 is located on the negative side of the second detection electrode 82 in the axis-X direction and so disposed as to overlap with a front end portion of the second movable section 322. That is, the first dummy electrode 83 faces a portion of the first movable section 321 that is a portion farther from the swing axis J than the first detection electrode 81, and the second dummy electrode 84 faces a portion of the second movable section 322 that is a portion farther from the swing axis J than the second detection electrode 82.

Although not shown, when the inertial sensor 1 is driven, drive voltage is applied to the sensor device 3 via the wiring line 75. To this end, the first detection electrode 81 is coupled to a QV amplifier via the wiring line 76, and the second detection electrode 82 is coupled to another QV amplifier via the wiring line 77. As a result, capacitance Ca is formed between the first movable section 321 and the first detection electrode 81, and capacitance Cb is formed between the second movable section 322 and the second detection electrode 82.

When the acceleration Az acts on the inertial sensor 1, the movable element 32 performs seesaw swing around the swing axis J. The seesaw swing of the movable element 32 changes the gap between the first movable section 321 and the first detection electrode 81 and the gap between the second movable section 322 and the second detection electrode 82 in opposite phases, and the capacitance Ca and the capacitance Cb change in opposite phases accordingly. The inertial sensor 1 can therefore detect the acceleration Az based on the difference between the capacitance Ca and the capacitance Cb (amount of change in capacitance).

The inertial sensor 1 includes the protrusion 6, which protrude from the bottom surface of the recess 21 of the substrate 2 toward the movable element 32, as shown in FIGS. 1 and 3. In the present embodiment, the protrusions 6 are located at a plurality of positions and each formed integrally with the substrate 2. That is, the protrusions 6 are formed as part of the substrate 2.

The thus configured protrusions 6 come into contact with the lower surface of the movable element 32 when the movable element 32 performs excessive seesaw swing and therefore function as a stopper that prevents the movable element 32 from performing more excessive seesaw swing. Providing the protrusions 6, which function as a stopper, as described above can suppress excessive approach and contact over a large area between the movable element 32 and the first and second detection electrodes 81, 82, the potentials of which differ from each other, and can therefore effectively suppress occurrence of a "sticking" phenomenon in which the movable element 32 sticks to the first and second detection electrodes 81, 82 due to electrostatic attraction produced between the movable element 32 and the first and second detection electrodes 81, 82 and does not detach from the first and second detection electrodes 81, 82.

The protrusions 6 include first protrusions 61, which are so provided as to overlap with the first movable section 321, and second protrusions 62, which are so provided as to overlap with the second movable section 322, in the plan view along the axis-Z direction. The first protrusions 61 have the function of suppressing the excessive approach and other behaviors between the movable element 32 and the first detection electrode 81, and the second protrusions 62 have the function of suppressing the excessive approach and other behaviors between the movable element 32 and the second detection electrode 82.

Further, the first protrusions 61 each include a proximal protrusion 611, which is so provided as to be shifted from the swing axis J toward the positive side of the axis-X direction, and a distal protrusion 612, which is so provided as to be farther from the swing axis J than the proximal protrusion 611, that is, provided on the positive side of the proximal protrusion 611. Similarly, the second protrusions 62 each include a proximal protrusion 621, which is so provided as to be shifted from the swing axis J toward the negative side of the axis-X direction, and a distal protrusion 622, which is so provided as to be farther from the swing axis J than the proximal protrusion 621, that is, provided on the negative side of the proximal protrusion 621. The protrusions 611, 612, 621, and 622 are so provided that one set of protrusions 611, 612, 621, and 622 are located on each of the axis-Y-direction positive and negative sides of an imaginary straight line Rx, which will be described later.

The first protrusions 61 and the second protrusions 62 have the same configuration and are symmetrically provided with respect to the swing axis J in the plan view along the axis-Z direction. Therefore, in the following description, the first protrusions 61 will be representatively described, and no description of the second protrusions 62 will be made for convenience of the description.

When acceleration indicated by the arrow Acc acts on the inertial sensor, and the movable element 32 performs excessive clockwise seesaw swing, the first movable section 321 first comes into contact with the proximal protrusions 611, as shown in FIG. 4. Even when the first movable section 321 comes into contact with the proximal protrusions 611, the movable element 32 does not stop performing the clockwise seesaw swing. Thereafter, when the movable element 32 further keeps performing the clockwise seesaw swing, the first movable section 321 comes into contact with the distal protrusions 612, as shown in FIG. 5. That is, further seesaw swing of the movable element 32 is restricted by the two-stage contact. When the movable element 32 performs seesaw swing having a relatively small magnitude, the movable element 32 comes into contact with the proximal protrusions 611, and the clockwise seesaw swing then stops before the movable element 32 comes into contact with the distal protrusions 612. The swing direction may then be reversed, and the movable element 32 may pivot back in the counterclockwise direction in some cases.

The configuration in which the first movable section 321 comes into contact with the proximal protrusions 611 thus achieves an inertial sensor 1 that suppresses breakage of the movable element 32 and excels in mechanical strength, as compared with the inertial sensor in the related art.

The proximal protrusions 611 are covered with the first detection electrode 81, and the distal protrusions 612 are covered with the first dummy electrode 83. The configuration in which the proximal protrusions 611 and the distal protrusions 612 are covered with the respective electrodes as described above can prevent the surfaces of the proximal protrusions 611 and the distal protrusions 612 from being charged when the alkali metal ion in the substrate 2 moves. The configuration described above can effectively suppress unintended electrostatic attraction that is produced between the proximal protrusions 611 and the first movable section 321 and between the distal protrusions 612 and the first movable section 321 and leads to malfunction of the movable element 32.

Covering the proximal protrusions 611 with the first detection electrode 81, in other words, providing the first detection electrode 81 also on the proximal protrusions 611 allows a further increase in the area of the first detection electrode 81, whereby the capacitance Ca formed between the first movable section 321 and the first detection electrode 81 can be further increased. On the other hand, covering the distal protrusions 612 with the first dummy electrode 83 causes the first movable section 321 and the distal protrusions 612 to have the same potential, substantially resulting in no unintended electrostatic attraction that is produced between the first movable section 321 and the distal protrusions 612 and leads to malfunction of the movable element 32. The acceleration Az is therefore detected with improved accuracy.

The surface of each of the proximal protrusions 611, in particular, the portion where each of the proximal protrusions 611 come into contact with the first movable section 321 and a portion around the contact portion are covered with an insulating film 89 disposed on the first detection electrode 81. The insulating film 89 functions as a gap material that provides a gap between the first movable section 321 and the first detection electrode 81 when the first movable section 321 comes into contact with the proximal protrusion 611. As a result, the excessive approach of the movable section 321 to the first detection electrode 81 can be suppressed, whereby generation of excessive electrostatic attraction therebetween can be suppressed. The adhesion of the movable section 32 to the proximal protrusions 611 can thus be effectively suppressed. The insulting film 89 is not necessarily made of a specific material and can be formed, for example, of a silicon oxide ($SiO_2$) film.

In the present embodiment, to cause the first movable section 321 to come into contact with the proximal protrusions 611 before the distal protrusions 612, a height T12 of the distal protrusions 612 is so designed as to be smaller than a height T11 of the proximal protrusions 611. In other words, the gap between the movable element 32 and the distal protrusions 612 is so designed to be wider than the gap between the movable element 32 and the proximal protrusions 611. The height T11 means the height of a contact section P1 of a structure including the first detection electrode 81 and the insulating film 89 on each of the proximal protrusions 611, and the height T12 means the height of a contact section P2 of a structure including the first dummy electrode 83 on each of the distal protrusions 612. The contact sections P1 and P2 will be described later.

More specifically, let F be an imaginary flat plane including the lower surface of the movable element 32 having come into contact with the proximal protrusions 611 in a plan in view along the axis-Y direction, the contact section P2 of each of the distal protrusions 612, which is the contact section that comes into contact with the movable element 32, is located below the imaginary flat plane F, that is, on the negative side of the imaginary flat plane F in the axis-Z direction. In the configuration described above, when the movable element 32 performs excessive clockwise seesaw swing, the first movable section 321 is more reliably allowed to come contact with the proximal protrusions 611 before the distal protrusions 612.

Further, the proximal protrusions 611 is so provided as to overlap with the base portion of the first movable section 321. Therefore, when the first movable section 321 comes into contact with the proximal protrusions 611, the resultant impact bends the first movable section 321 in such a way that a front end portion of the first movable section 321 is displaced downward, so that compression force in the axis-X direction acts on the lower surface of the first movable section 321, as shown in FIG. 5. A situation in which tensile force in the axis-X direction, which is opposite the compression force, acts on the lower surface of the first movable section 321 can therefore be effectively suppressed. The lower surface of the first movable section 321 is roughed and minute irregularities are likely to be formed thereon when the silicon substrate is patterned in the Bosch process. The reason for this is that the front surface of the substrate 2 is positively charged resulting from the movement of the alkali metal ion in the Bosch process, and the lower surface (rear surface) of the silicon substrate is etched by the positive ion electrostatically deflected and so incident as to pass through the silicon substrate.

That is, when the positions of the proximal protrusions 611 are shifted from the center position of the first movable section 321 in the axis-X direction toward the positive side of the axis-X direction, and the impact produced when the first movable section 321 comes into contact with the proximal protrusions 611 could undesirably bend a portion of the first movable section 321 that is the portion from the mount 22 to the proximal protrusions 611 toward the negative side of the axis-Z direction and portion of the first movable section 321 that is the portion from the proximal protrusions 611 to the portion on the positive side of the axis-X direction toward the positive side of the axis-Z direction. Therefore, when tensile stress is induced at the lower surface of the first movable section 321, cracking is likely to occur in some cases. Therefore, disposing the proximal protrusions 611 in positions sufficiently close to the base portion of the first movable section 321 so that the compression force acts on the lower surface of the first movable section 321 allows suppression of the cracking in the first movable section 321, whereby an inertial sensor 1 that excels in mechanical strength is achieved.

A separation distance D1 between the contact section P1 and the swing axis J is not limited to a specific value. For example, let L2 be the length of the second movable section 322, as shown in FIG. 3, and $L2/10 \leq D1 \leq L2/2$ is preferably satisfied, more preferably, $L2/10 \leq D1 \leq L2/4$ is preferably satisfied. As a result, the proximal protrusions 611 can be so provided as to be sufficiently close to the base portion of the first movable section 321, whereby the effect described above, that is, the effect that causes tensile stress to be unlikely to be induced at the lower surface of the first movable section 321 can be more reliably provided.

On the other hand, a separation distance D2 between the contact section P2 and the swing axis J is not limited to a specific value. For example, let L2 be the length of the second movable section 322, and $L2/4 \leq D2 \leq L2/1.5$ is preferably satisfied, more preferably, $L2/3 \leq D2 \leq L2/2$ is preferably satisfied. As a result, the distal protrusions 612 can be so provided as to be sufficiently close to the base portion of the first movable section 321, whereby the impact that acts on the first movable section 321 when the first movable section 321 comes into contact with the distal protrusions 612 can be sufficiently reduced. Damage of the first movable section 321 can therefore be effectively suppressed, whereby an inertial sensor 1 having more excellent mechanical strength can be achieved.

The plurality of proximal protrusions 611 are so provided as to be separate from each other along the axis-Y direction, which is parallel to the swing axis J, in the plan view along the axis-Z direction, as shown in FIG. 3. Particularly in the present embodiment, the proximal protrusions 611 are a pair of proximal protrusions 611. Let Rx be an imaginary straight line that intersects the center of the movable element 32 and extends in the axis-X direction in the plan view along the axis-Z direction, and one of the proximal protrusions 611 is provided on the positive side of the imaginary straight line Rx in the axis-Y direction, and the other one of the proximal protrusions 611 is provided on the negative side of the imaginary straight line Rx in the axis-Y direction. As a result, when the first movable section 321 comes into contact with the proximal protrusions 611, a situation in which the movable element 32 is unnecessarily displaced (bent) around the axis X can be effectively suppressed. Particularly in the present embodiment, the one proximal protrusion 611 is so provided as to overlap with a positive end portion of the first movable section 321 in the axis-Y direction, and the other proximal protrusion 611 is so provided as to overlap with a negative end portion of the first movable section 321 in the axis-Y direction. The separation distance between the pair of proximal protrusions 611, 611 can therefore be further increased, whereby occurrence of the unnecessary displacement described above can be more effectively suppressed. It is, however, noted that the number of proximal protrusions 611 is not limited to a specific number and the arrangement of the proximal protrusions 611 is not limited to a specific arrangement. For example, the number of proximal protrusions 611 may be one or three.

Similarly, the plurality of distal protrusions 612 are so provided as to be separate from each other along the axis-Y direction, which is parallel to the swing axis J, in the plan view along the axis-Z direction. Particularly in the present embodiment, the distal protrusions 612 are a pair of distal protrusions 612. One of the distal protrusions 612 is provided on the positive side of the imaginary straight line Rx in the axis-Y direction, and the other one of the distal protrusions 612 is provided on the negative side of the imaginary straight line Rx in the axis-Y direction, as in the case of the proximal protrusions 611 described above. As a result, when the first movable section 321 comes into contact with the distal protrusions 612, a situation in which the movable element 32 is unnecessarily displaced (bent) around the axis X can be effectively suppressed. Particularly in the present embodiment, the one distal protrusion 612 is so provided as to overlap with the positive end portion of the first movable section 321 in the axis-Y direction, and the other distal protrusion 612 is so provided as to overlap with the negative end portion of the first movable section 321 in the axis-Y direction. The separation distance between the pair of distal protrusions 612, 612 can therefore be further increased, whereby occurrence of the unnecessary displacement described above can be more effectively suppressed. It is, however, noted that the number of distal protrusions 612 is not limited to a specific number and the arrangement of the distal protrusions 612 is not limited to a specific arrangement. For example, the number of distal protrusions 612 may be one or three. Further, the protrusions 611, 612, 621, and 622 each have a circular shape in the plan view, but not necessarily. For example, the shape of each of the protrusions 611, 612, 621, and 622 in the plan view may be a quadrangular shape or any other polygonal shape, a semicircular shape, an elliptical shape, or an elongated shape extending in the axis-X direction or the axis-Y direction.

The inertial sensor 1 has been described. The thus configured inertial sensor 1 includes, provided that the axes X, Y, and Z are three axes perpendicular to one another, the substrate 2, the movable element 32, which swings around the swing axis J extending along the axis Y, and the protrusions 6, which overlap with the movable element 32 in the plan view along the axis-Z direction and protrude from the substrate 2 toward the movable element 32, as described above. The protrusions 6 include the proximal protrusions 611 and the distal protrusions 612, which are so located as to be farther from the swing axis J than the proximal protrusions 611. When the movable element 32 swings relative to the substrate 2 around the swing axis J, the proximal protrusions 611 come into contact with the movable element 32, and then the distal protrusions 612 come into contact with the movable element 32. As described above, the configuration in which the proximal protrusions 611 are first caused to come into contact with movable element 32 allows reduction in the impact acting on the movable element 32 at the time of the contact as compared, for example, with that in the case in the related art where the distal protrusions 612 first come into contact with the movable element 32. An inertial sensor 1 that suppresses breakage of the movable element 32 and excels in mechanical strength as compared with the inertial sensor in the related art is therefore achieved.

The plurality of proximal protrusions 611 are so provided as to be separate from each other in the direction extending along the swing axis J, as described above. As a result, when the movable element 32 comes into contact with the proximal protrusions 611, the situation in which the movable element 32 is unnecessarily displaced (bent) around the axis X can be effectively suppressed.

Further, the plurality of distal protrusions 612 are so provided as to be separate from each other in the direction extending along the swing axis J, as described above. As a result, when the movable element 32 comes into contact with the distal protrusions 612, the situation in which the movable element 32 is unnecessarily displaced (bent) around the axis X can be effectively suppressed.

When the proximal protrusions 611 come into contact with the movable element 32, the lower surface of the movable element 32, that is, the surface facing the substrate 2 contracts in the axis-X direction, as described above. Cracking in the movable element 32 can thus be effectively suppressed. Breakage of the movable element 32 can therefore be effectively suppressed.

The inertial sensor 1 further includes the first detection electrode 81 as a detection electrode, which is provided on the substrate 2 and overlaps with the movable element 32 in the plan view along the axis-Z direction, and the first dummy electrode 83 as a dummy electrode, which is provided on the substrate 2, overlaps with a region of the movable element 32 that is the region that does not overlap with the first detection electrode 81 in the plan view along the axis-Z direction, and has the same potential as that at the movable element 32, as described above. The first dummy electrode 83 therefore prevents unnecessary electrostatic attraction from being substantially produced between the substrate 2 and the movable element 32. The acceleration Az in the axis-Z direction can therefore be accurately detected based on a change in the capacitance Ca between the movable element 32 and the first detection electrode 81.

The proximal protrusions 611 are covered with the first detection electrode 81, and the distal protrusions 612 are covered with the first dummy electrode 83, as described above. Covering the proximal protrusions 611 with the first detection electrode 81 allows a further increase in the area of the first detection electrode 81, whereby the capacitance Ca formed between the first movable section 321 and the first detection electrode 81 can be further increased. On the other hand, covering the distal protrusions 612 with the first dummy electrode 83 causes the movable element 32 and the distal protrusions 612 to have the same potential, so that unnecessary electrostatic attraction is not substantially produced between the movable element 32 and the distal protrusions 612. The acceleration Az is therefore detected with improved accuracy.

The movable element 32 includes the first movable section 321 and the second movable section 322, which are so provided as to sandwich the swing axis J and differ from each other in terms of rotational moment around the swing axis J, and the protrusions 6 include the first protrusions 61, which overlap with the first movable section 321 in the plan view along the axis-Z direction, and the second protrusions 62, which overlap with the second movable section 322 in the plan view along the axis-Z direction. The effect described above can therefore be provided irrespective of the direction in which the movable element 32 swings relative to the substrate 2 around the swing axis J. An inertial sensor 1 that further excels in mechanical strength is therefore achieved.

Second Embodiment

Figure 6:
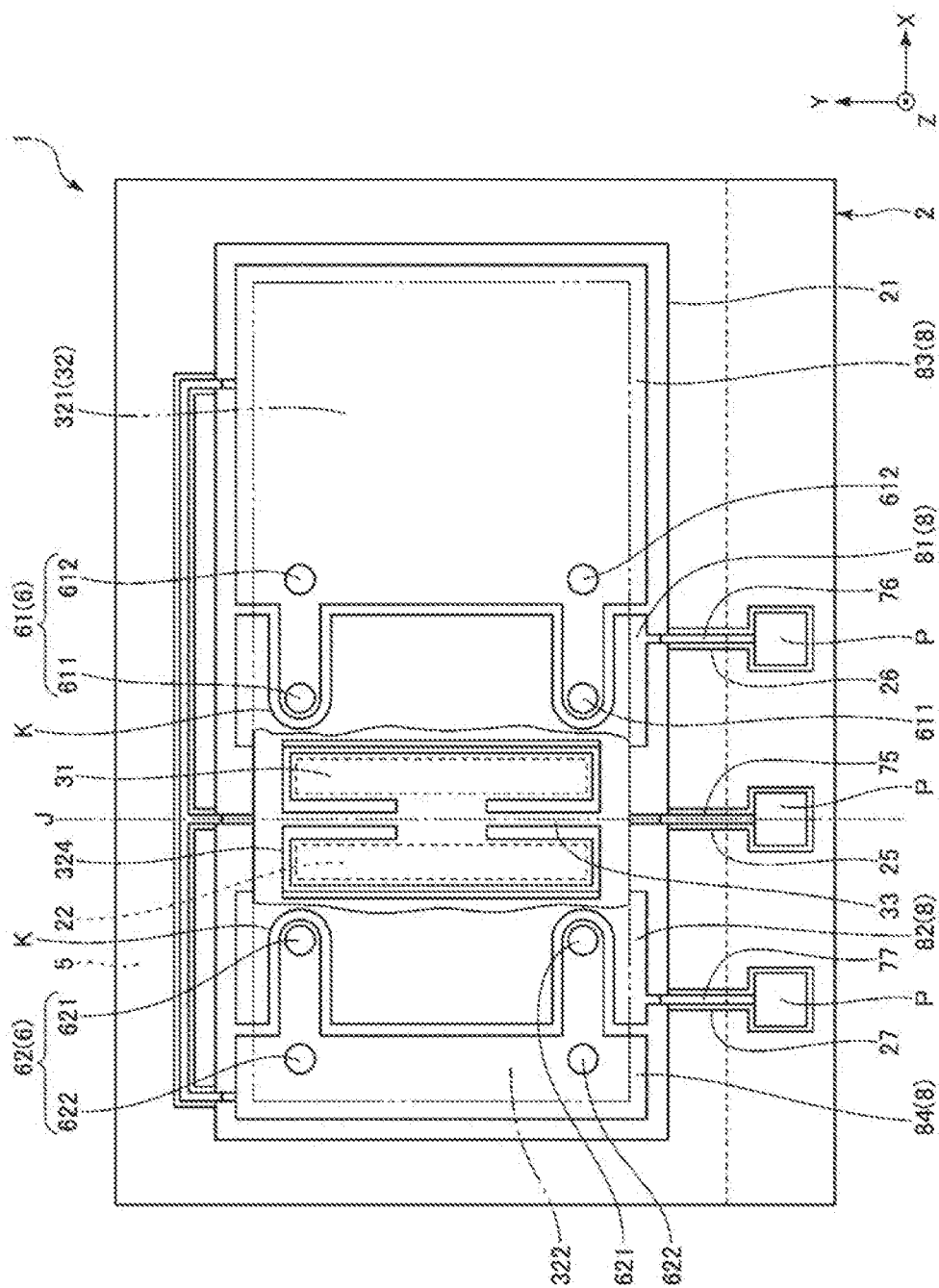
FIG. 6 is a plan view showing an inertial sensor according to a second embodiment.

FIG. 6 is a plan view showing an inertial sensor according to a second embodiment.

The present embodiment is the same as the first embodiment described above except the protrusions 6 are configured differently. The following description of the present embodiment will be primarily made of the difference from the embodiment described above, and the same items as those in the embodiment described above will not be described. In FIG. 6, the same configurations as those in the embodiment described above have the same reference characters. In the present embodiment, the first protrusions 61 and the second protrusions 62 have the same configuration. Therefore, the first protrusions 61 will be representatively described, and no description of the second protrusions 62 will be made.

In the inertial sensor 1 shown in FIG. 6, the proximal protrusions 611, which form the first protrusions 61, are covered with the first dummy electrode 83, as are the distal protrusions 612. The first movable section 321 and the proximal protrusions 611 therefore have the same potential, substantially resulting in no unintended electrostatic attraction that is produced between the first movable section 321 and the proximal protrusions 611 and leads to malfunction of the movable element 32. The acceleration Az is therefore detected with improved accuracy.

In the present embodiment, a front end portion of the first detection electrode 81, that is, an end portion facing the positive side of the axis-X direction is shifted from the proximal protrusions 611 toward the front end of the first movable section 321, that is, the positive side of the axis-X direction, and the proximal protrusions 611 are each disposed in the form of an island in the first detection electrode 81. In view of the configuration described above, cutouts K, which extend from the front end of the first detection electrode 81 to the proximal protrusions 611, are formed, and the first dummy electrode is caused to extend into the cutouts K, so that the proximal protrusions 611 are covered with the first dummy electrode 83 with no contact between the first detection electrode 81 and the first dummy electrode 83 allowed. The configuration described above allows the proximal protrusions 611 to be covered with the first dummy electrode 83 with a sufficiently wide area of the first detection electrode 81 ensured.

As described above, in the inertial sensor 1 according to the present embodiment, the proximal protrusions 611 and the distal protrusions 612 are covered with the first dummy electrode 83. Similarly, the proximal protrusions 621 and the distal protrusions 622 are covered with the second dummy electrode 84. In the configuration described above, the protrusions 6 and the movable element 32 have the same potential, substantially resulting in no unintended electrostatic attraction that is produced between the protrusions 6 and the movable element 32 and leads to malfunction of the movable element 32. The acceleration Az is therefore detected with improved accuracy.

The same effects as those of the above-described first embodiment can also be exhibited by the above-described second embodiment.

Third Embodiment

Figure 7:
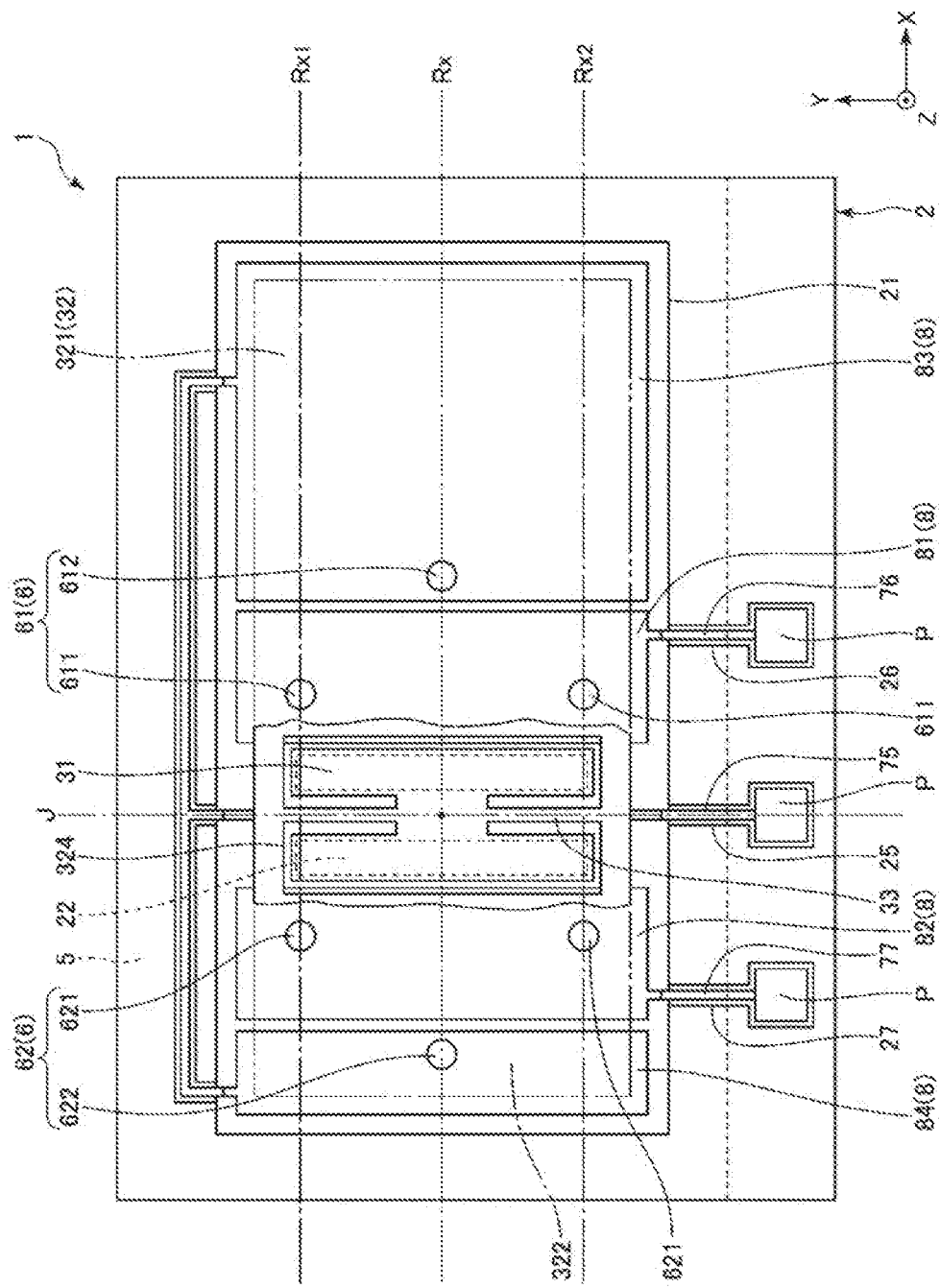
FIG. 7 is a plan view showing an inertial sensor according to a third embodiment.

FIG. 7 is a plan view showing an inertial sensor according to a third embodiment.

The present embodiment is the same as the first embodiment described above except the protrusions 6 are configured differently. The following description of the present embodiment will be primarily made of the difference from the embodiments described above, and the same items as those in the embodiments described above will not be described. In FIG. 7, the same configurations as those in the embodiments described above have the same reference characters. In the present embodiment, the first protrusions 61 and the second protrusions 62 have the same configuration. Therefore, the first protrusions 61 will be representatively described, and no description of the second protrusions 62 will be made.

In the inertial sensor 1 shown in FIG. 7, the number of distal protrusions 612 is one. Specifically, let Rx1 be a first imaginary straight line that intersects the one proximal protrusion 611 and extends in the axis-X direction in the plan view along the axis-Z direction and Rx2 be a second imaginary straight line that intersects the other proximal protrusion 611 and extends in the axis-X direction in the plan view along the axis-Z direction, and the distal protrusion 612 is provided between the first imaginary straight line Rx1 and the second imaginary straight line Rx2. The arrangement described above allows the two proximal protrusions 611 and the one distal protrusion 612 to support the first movable section 321 in a well-balanced manner and unnecessarily displacement and bending of the movable element 32 around the axis X at the time of contact to be effectively suppressed. Particularly in the present embodiment, the distal protrusion 612 is so provided as to overlap with the imaginary straight lines Rx in the plan view along the axis-Z direction. The effect described above can therefore be more noticeably provided. Further, the number of distal protrusions 612 can be reduced as compared with that in the first embodiment described above, whereby the damping can be reduced accordingly.

As described above, in the inertial sensor 1 according to the present embodiment, the distal protrusion 612 is provided between the first imaginary straight line Rx1, which intersects the one proximal protrusion 611 and extends in the axis-X direction in the plan view along the axis-Z direction, and the second imaginary straight line Rx2, which intersects the other proximal protrusion 611 and extends in the axis-X direction in the plan view along the axis-Z direction. The arrangement described above allows the two proximal protrusions 611 and the one distal protrusion 612 to support the first movable section 321 in a well-balanced manner and unnecessarily displacement and bending of the movable element 32 around the axis X at the time of contact to be effectively suppressed.

The same effects as those of the above-described first embodiment can also be exhibited by the above-described third embodiment.

Fourth Embodiment

Figure 8:
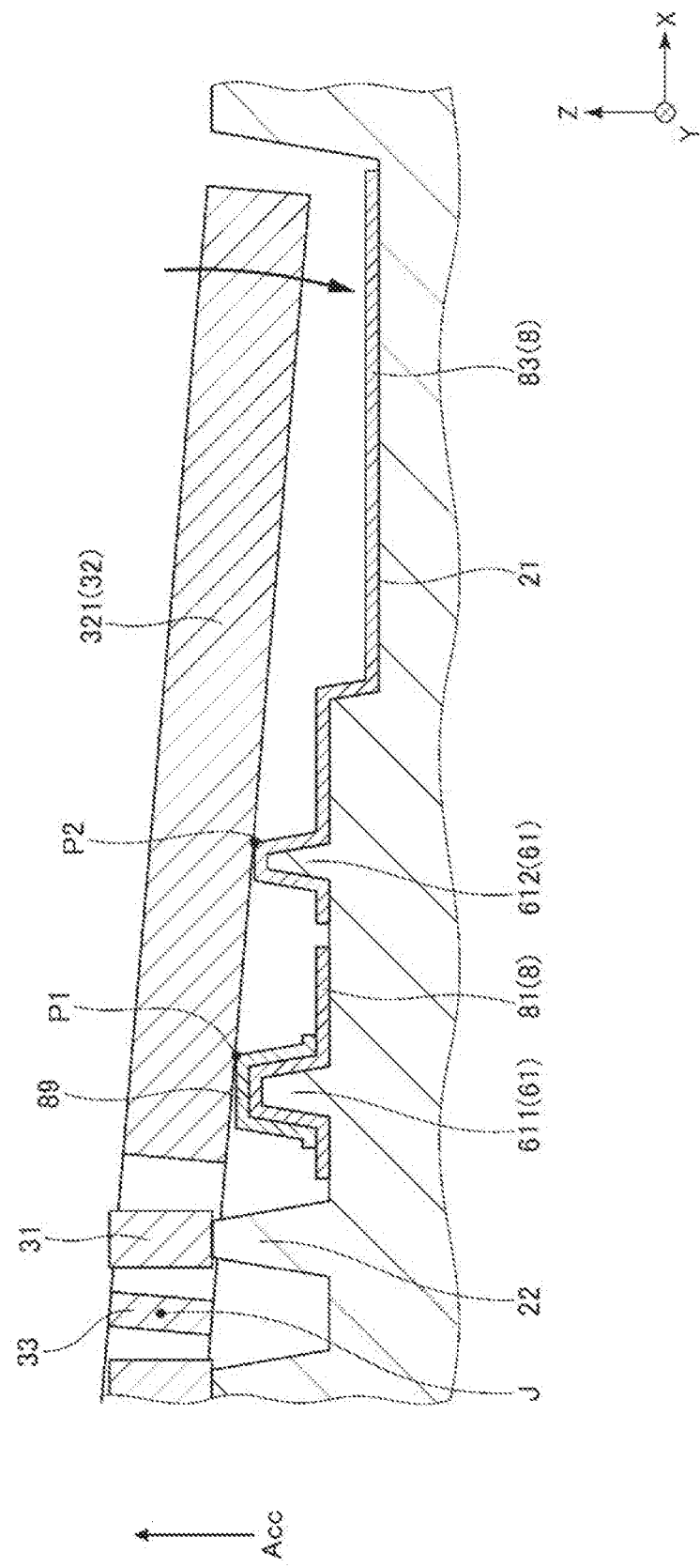
FIG. 8 is a cross-sectional view showing an inertial sensor according to a fourth embodiment.

FIG. 8 is a cross-sectional view showing an inertial sensor according to a fourth embodiment.

The present embodiment is the same as the first embodiment described above except the protrusions 6 are configured differently. The following description of the present embodiment will be primarily made of the difference from the embodiments described above, and the same items as those in the embodiments described above will not be described. In FIG. 8, the same configurations as those in the embodiments described above have the same reference characters. In the present embodiment, the first protrusions 61 and the second protrusions 62 have the same configuration. Therefore, the first protrusions 61 will be representatively described, and no description of the second protrusions 62 will be made.

When acceleration indicated by the arrow Acc acts on the inertial sensor, and the movable element 32 performs excessive clockwise seesaw swing, the first movable section 321 comes into contact with the proximal protrusions 611 and the distal protrusions 612 at the same time, as shown in FIG. 8. Causing the movable section 32 to come into contact with the proximal protrusions 611 and the distal protrusions 612 at the same time as described above allows reduction in the impact acting on the movable element 32 at the time of contact, as compared, for example, with that in the case in the related art where the distal protrusions 612 first come into contact with the movable element 32. An inertial sensor 1 that suppresses breakage of the movable element 32 and excels in mechanical strength as compared with the inertial sensor in the related art is therefore achieved.

The inertial sensor 1 has been described. The thus configured inertial sensor 1 includes, provided that the axes X, Y, and Z are three axes perpendicular to one another, the substrate 2, the movable element 32, which swings around the swing axis J extending along the axis Y, and the protrusions 6, which overlap with the movable element 32 in the plan view along the axis-Z direction and protrude from the substrate 2 toward the movable element 32, as described above. The protrusions 6 include the proximal protrusions 611 and the distal protrusions 612, which are so located as to be farther from the swing axis J than the proximal protrusions 611. When the movable element 32 swings relative to the substrate 2 around the swing axis J, the proximal protrusions 611 and the distal protrusions 612 come into contact with the movable element 32 at the same time. Causing the movable section 32 to come into contact with the proximal protrusions 611 and the distal protrusions 612 at the same time as described above allows reduction in the impact acting on the movable element 32 at the time of contact, as compared, for example, with that in the case in the related art where the distal protrusions 612 first come into contact with the movable element 32. An inertial sensor 1 that suppresses breakage of the movable element 32 and excels in mechanical strength as compared with the inertial sensor in the related art is therefore achieved.

The same effects as those of the above-described first embodiment can also be exhibited by the above-described fourth embodiment.

Fifth Embodiment

Figure 9:
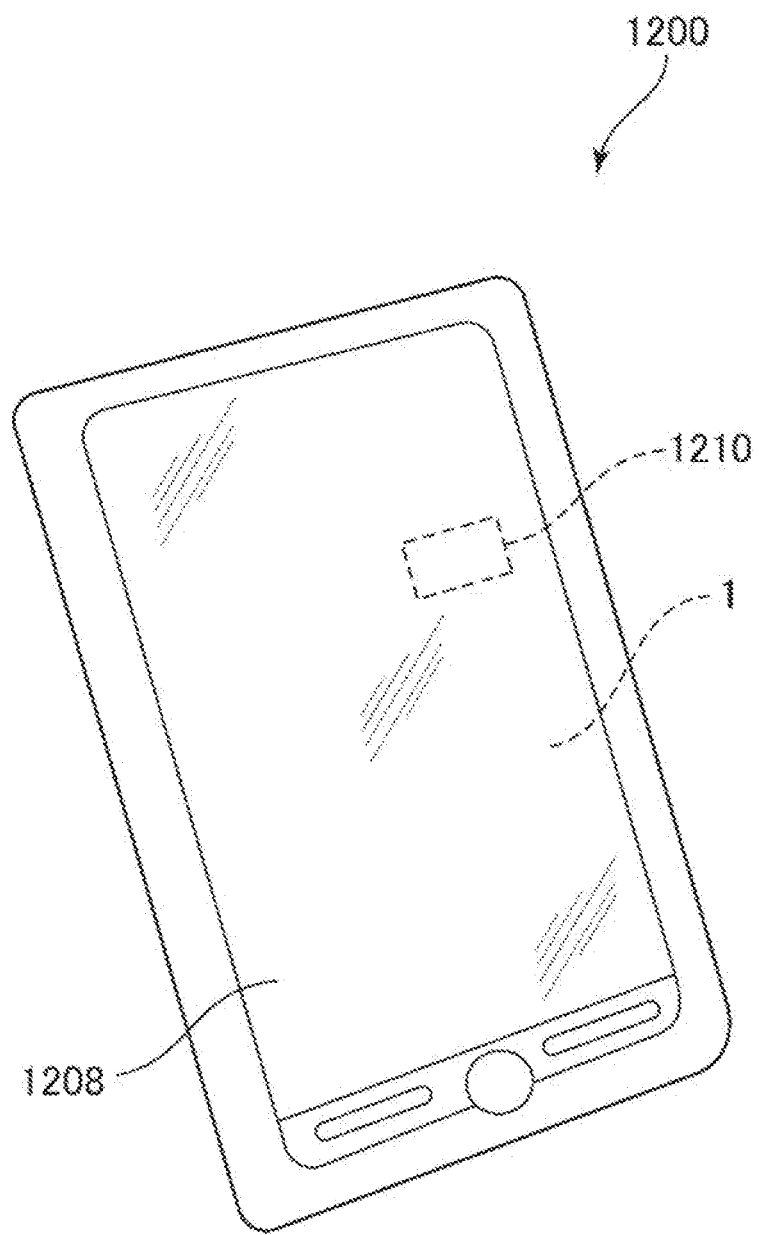
FIG. 9 is a plan view showing a smartphone as an electronic instrument according to a fifth embodiment.

FIG. 9 is a plan view showing a smartphone as the electronic instrument according to a fifth embodiment.

A smartphone 1200 shown in FIG. 9 is a smartphone based on the electronic instrument according to the present disclosure. The smartphone 1200 accommodates the inertial sensor 1 and a control circuit 1210, which performs control based on a detection signal outputted from the inertial sensor 1. Detection data detected by the inertial sensor 1 is transmitted to the control circuit 1210, and the control circuit 1210 recognizes the attitude and behavior of the smartphone 1200 based on the received detection data and can change an image displayed on a display section 1208, issue an alarm sound or an effect sound, and drive a vibration motor to vibrate the main body of the smartphone 1200.

The thus configured smartphone 1200 as the electronic instrument includes the inertial sensor 1 and the control circuit 1210, which performs control based on the detection signal outputted from the inertial sensor 1. The smartphone 1200 can therefore benefit from the above-mentioned effects provided by the inertial sensor 1 and hence have high reliability.

The electronic instrument according to the present disclosure is not limited to the smartphone 1200 described above and can, for example, be a personal computer, a digital still camera, a tablet terminal, a timepiece, a smartwatch, an inkjet printer, a laptop personal computer, a television receiver, smart glasses, a wearable terminal, such as a head mounted display (HMD), a video camcorder, a video tape recorder, a car navigator, a drive recorder, a pager, an electronic notepad, an electronic dictionary, an electronic translator, a desktop calculator, an electronic game console, a toy, a word processor, a workstation, a TV phone, a security television monitor, electronic binoculars, a POS terminal, a medical instrument, a fish finder, a variety of measuring instruments, an instrument for a mobile terminal base station, a variety of meters for car, railway car, airplane, helicopter, and ship, a flight simulator, and a network server.

Sixth Embodiment

Figure 10:
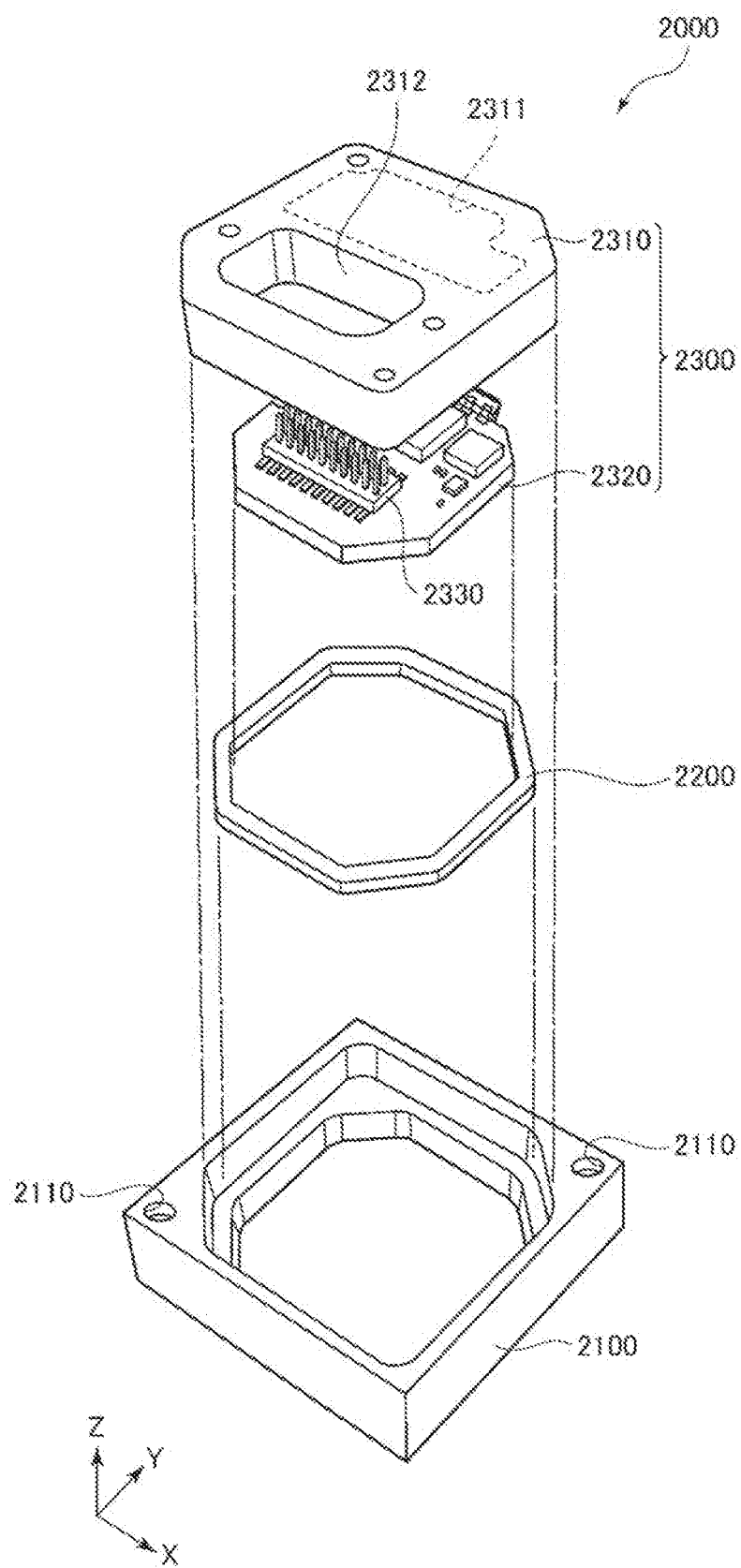
FIG. 10 is an exploded perspective view showing an inertial measurement unit as the electronic instrument according to a sixth embodiment.
Figure 11:
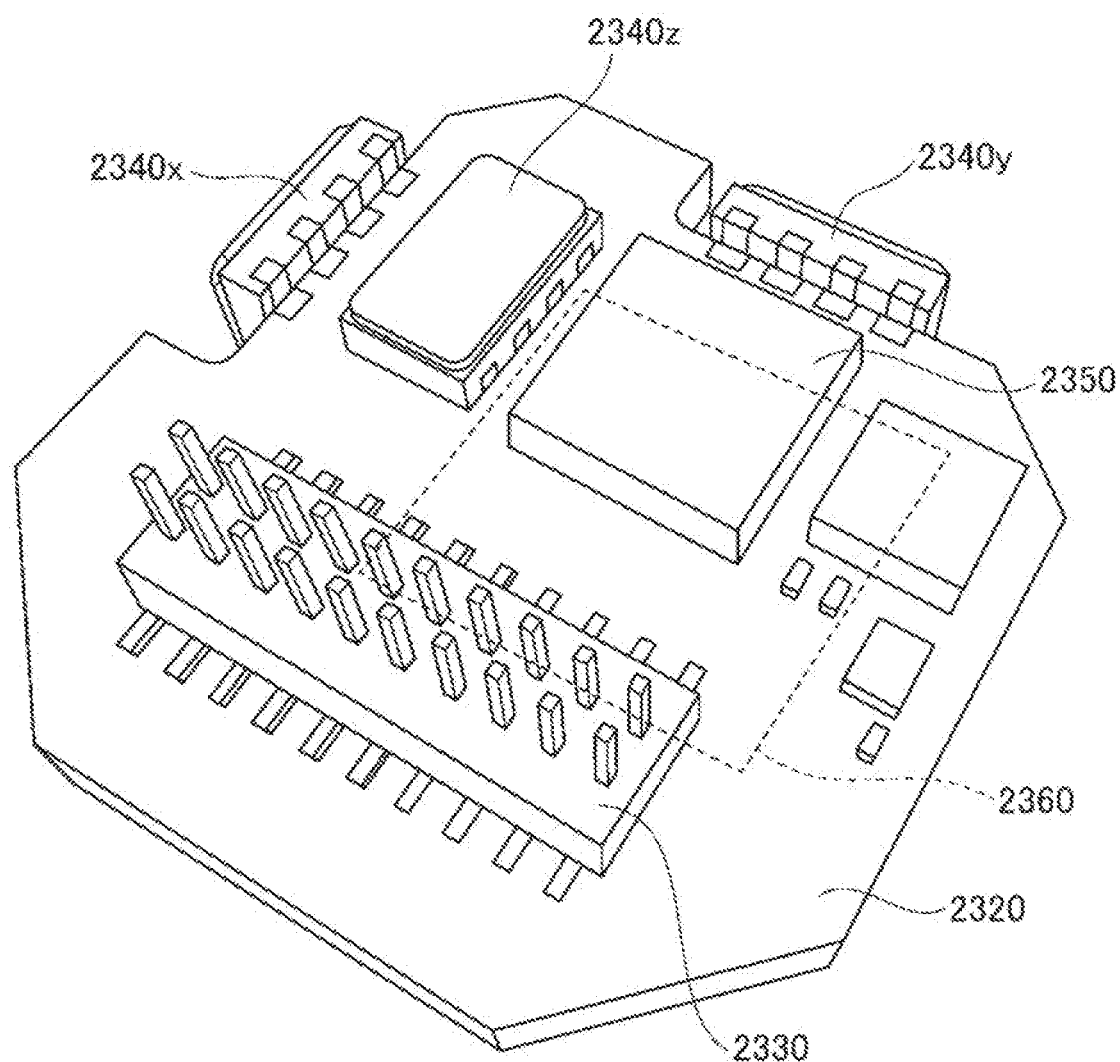
FIG. 11 is a perspective view of a substrate provided in the inertial measurement unit shown in FIG. 10.

FIG. 10 is an exploded perspective view showing an inertial measurement unit as the electronic instrument according to a sixth embodiment. FIG. 11 is a perspective view of a substrate provided in the inertial measurement unit shown in FIG. 10.

An inertial measurement unit 2000 (IMU) shown as the electronic instrument in FIG. 10 is an inertial measurement unit that detects the attitude and behavior of an apparatus to which the inertial measurement unit 2000 is attached, such as an automobile and a robot. The inertial measurement unit 2000 functions as a six-axis motion sensor including a three-axis acceleration sensor and a three-axis angular velocity sensor.

The inertial measurement unit 2000 is a rectangular parallelepiped unit having a substantially square shape in the plan view. Threaded holes 2110 as fixing sections are formed in the vicinity of two vertices of a square body that are vertices located on a diagonal of the square. Two screws screwed into the two threaded holes 2110 can fix the inertial measurement unit 2000 to an attachment surface of the apparatus to which the inertial measurement unit 2000 is attached, such as an automobile. The inertial measurement unit 2000 can be so reduced in size as to be incorporated, for example, in a smartphone and a digital camera by part selection and design change.

The inertial measurement unit 2000 includes an outer enclosure 2100, a bonding member 2200, and a sensor module 2300, and the sensor module 2300 is inserted into the outer enclosure 2100 via the bonding member 2200. The outer shape of the outer enclosure 2100 is a rectangular parallelepiped having a substantially square shape in the plan view, as is the overall shape of the inertial measurement unit 2000 described above. The threaded holes 2110 are formed in the vicinity of two vertices of the square outer enclosure 2100 that are vertices located on a diagonal of the square. The outer enclosure 2100 has a box-like shape, and the sensor module 2300 is accommodated in the outer enclosure 2100.

The sensor module 2300 includes an inner enclosure 2310 and a substrate 2320. The inner enclosure 2310 is a member that supports the substrate 2320 and is so shaped as to be accommodated in the outer enclosure 2100. The inner enclosure 2310 has a recess 2311, which prevents the inner enclosure 2310 from coming into contact with the substrate 2320, and an opening 2312, which exposes a connector 2330, which will be described later. The thus configured inner enclosure 2310 is bonded to the outer enclosure 2100 via the bonding member 2200. The substrate 2320 is bonded to the lower surface of the inner enclosure 2310 with an adhesive.

The connector 2330, an angular velocity sensor 2340z, which detects angular velocity around the axis Z, an acceleration sensor 2350, which detects acceleration in the axes X, Y, and Z, and other components are mounted on the upper surface of the substrate 2320, as shown in FIG. 11. An angular velocity sensor 2340x, which detects angular velocity around the axis X, and an angular velocity sensor 2340y, which detects angular velocity around the axis Y, are mounted on the side surface of the substrate 2320. Any of the inertial sensors according to the present disclosure can be used as the acceleration sensor 2350.

A control IC 2360 is mounted on the lower surface of the substrate 2320. The control IC 2360 is a micro controller unit (MCU) and controls each portion of the inertial measurement unit 2000. A storage stores a program that specifies the order and content for detecting the acceleration and angular velocity, a program that digitizes detected data and incorporates the digitized data in packet data, data associated with the programs, and other pieces of information. A plurality of other electronic parts are also mounted on the substrate 2320.

Seventh Embodiment

Figure 12:
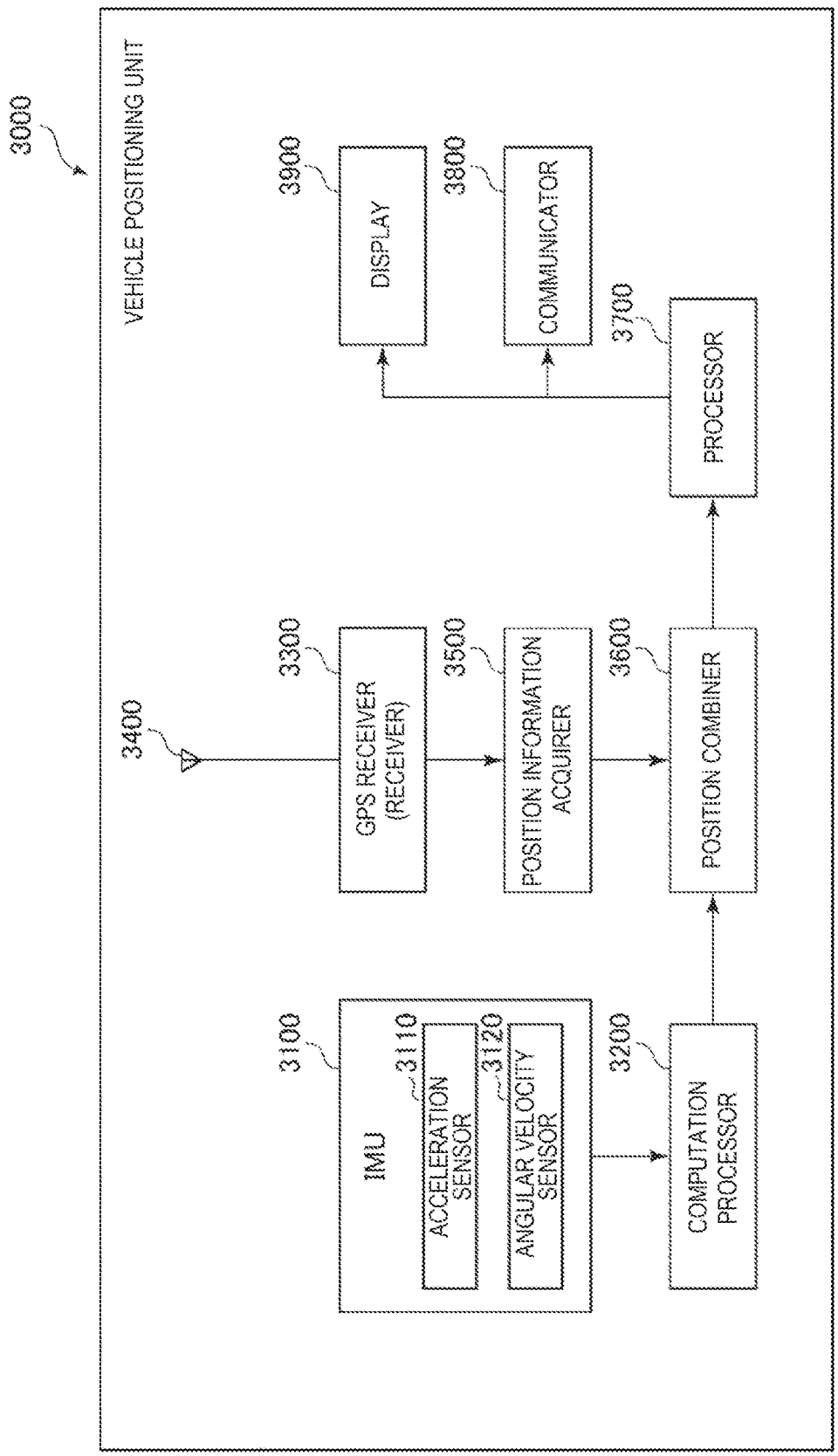
FIG. 12 is a block diagram showing the overall system of a vehicle positioning unit as the electronic instrument according to a seventh embodiment.
Figure 13:
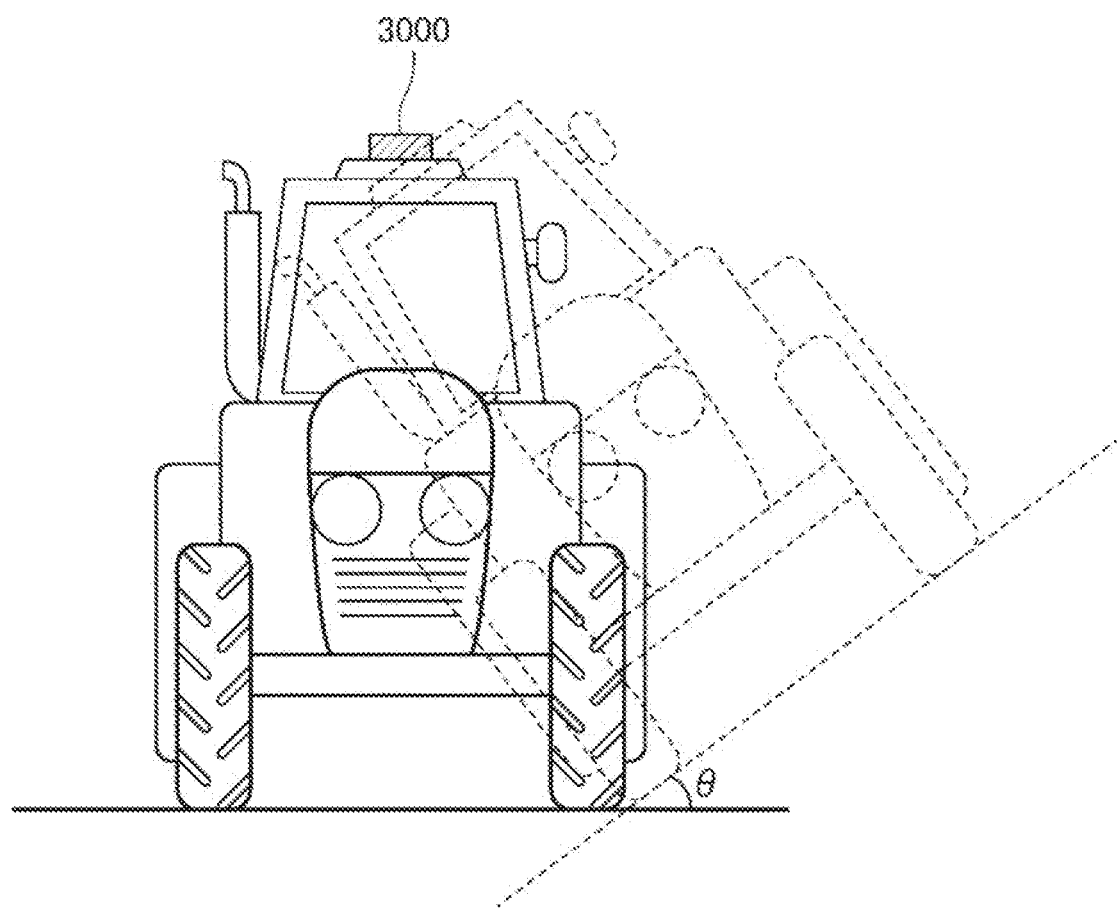
FIG. 13 shows an effect of the vehicle positioning unit shown in FIG. 12.

FIG. 12 is a block diagram showing the overall system of a vehicle positioning unit as the electronic instrument according to a seventh embodiment. FIG. 13 shows an effect of the vehicle positioning unit shown in FIG. 12.

A vehicle positioning unit 3000 shown in FIG. 12 is a unit that is attached to a vehicle when used and measures the position of the vehicle. The vehicle is not limited to a specific vehicle and may be any of a bicycle, an automobile, an autocycle, a train, an airplane, a ship, and other vehicles, and the present embodiment will be described with reference to a case where a four-wheeled automobile, particularly, an agricultural tractor is used as the vehicle.

The vehicle positioning unit 3000 includes an inertial measurement unit 3100 (IMU), a computation processor 3200, a GPS receiver 3300, a reception antenna 3400, a position information acquirer 3500, a position combiner 3600, a processor 3700, a communicator 3800, and a display 3900. The inertial measurement unit 3100 can, for example, be the inertial measurement unit 2000 described above.

The inertial measurement unit 3100 includes a three-axis acceleration sensor 3110 and a three-axis angular velocity sensor 3120. The computation processor 3200 receives acceleration data from the acceleration sensor 3110 and angular velocity data from the angular velocity sensor 3120, performs inertial navigation computation on the data, and outputs inertial navigation positioning data containing the acceleration and attitude of the vehicle.

The GPS receiver 3300 receives signals from GPS satellites via the reception antenna 3400. The position information acquirer 3500 outputs GPS positioning data representing the position (latitude, longitude, and altitude), velocity, and orientation of the vehicle positioning unit 3000 based on the signals received by the GPS receiver 3300. The GPS positioning data also contains status data representing the reception state, the reception time, and other pieces of information.

The position combiner 3600 calculates the position of the vehicle, specifically, the position on the ground along which the vehicle is traveling based on the inertial navigation positioning data outputted from the computation processor 3200 and the GPS positioning data outputted from the position information acquirer 3500. For example, even when the positions of the vehicle contained in the GPS positioning data are equal to one another, but the vehicle has a different attitude due to inclination e of the ground and other factors, as shown in FIG. 13, the position on the ground along which the vehicle is traveling varies. An accurate position of the vehicle cannot therefore be calculated based only on the GPS positioning data. In this case, the position combiner 3600 uses the inertial navigation positioning data to calculate the position on the ground along which the vehicle is traveling.

The processor 3700 performs predetermined processing on position data outputted from the position combiner 3600, and the processed data is displayed as the result of the positioning on the display 3900. The position data may be transmitted via the communicator 3800 to an external apparatus.

Eighth Embodiment

Figure 14:
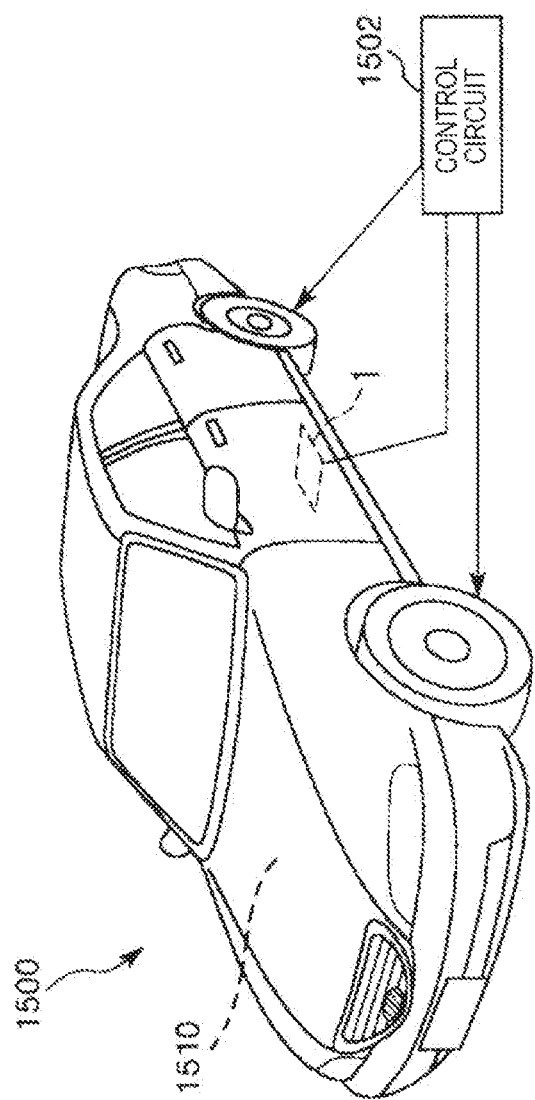
FIG. 14 is a perspective view showing a vehicle according to an eighth embodiment.

FIG. 14 is a perspective view showing a vehicle according to an eighth embodiment.

An automobile 1500 shown in FIG. 14 is an automobile based on the vehicle according to the present disclosure. In FIG. 14, the automobile 1500 includes a system 1510, which is at least any of an engine system, a brake system, and a keyless entry system. The inertial sensor 1 is built in the automobile 1500 and can detect the attitude of the vehicle body. The detection signal from the inertial sensor 1 is supplied to a control circuit 1502, which can control the system 1510 based on the signal.

As described above, the automobile 1500 as the vehicle includes the inertial sensor 1 and the control circuit 1502, which performs control based on the detection signal outputted from the inertial sensor 1. The automobile 1500 can therefore benefit from the above-mentioned effects provided by the inertial sensor 1 and hence have high reliability.

The inertial sensor 1 can also be widely used with a car navigation system, a car air conditioner, an anti-lock braking system (ABS), an airbag, a tire pressure monitoring system (TPMS), an engine control system, and an electronic control unit (ECU) that monitors or otherwise observes a battery in a hybrid automobile and an electric automobile. The vehicle is not limited to the automobile 1500 and may instead, for example, be a railway car, an airplane, a helicopter, a rocket, an artificial satellite, a ship, an automated guided vehicle (AGV), an elevator, an escalator, a bipedal walking robot, a drone or any other unmanned airplane, and a radio control model, a railway mode, and other toys.

The inertial sensor, the electronic instrument, and the vehicle according to the present disclosure have been described above based on the embodiments in the drawings, but the present disclosure is not limited thereto, and the configuration of each portion can be replaced with an arbitrary configuration having the same function. Further, another arbitrarily constituent part may be added to the present disclosure. The embodiments described above may be combined with each other as appropriate.

What is claimed is:

1. An inertial sensor comprising:
   three axes orthogonal to each other being defined as an X axis, a Y axis, and a Z axis;
   a substrate having a thickness along the Z axis;
   a movable element disposed over the substrate along the Z axis, the movable element swinging around a swing axis extending along the Y axis, the movable element having a fixed section, the fixed section being located adjacent to the swing axis;
   a mount disposed on the substrate, the mount protruding from the substrate, the mount extending along the Y axis, the mount being located adjacent to the swing axis, the movable element being fixed to the substrate via the fixed section and the mount;
   a proximal protrusion disposed on the substrate, the proximal protrusion protruding from the substrate, the proximal protrusion being overlapped with the movable element along the Z axis, the proximal protrusion being spaced apart from the swing axis by a first distance along the X axis;
   a detection electrode disposed on an entirety of the proximal protrusion;
   a insulating film disposed on the detection electrode at a top part of the proximal protrusion;
   a distal protrusion disposed on the substrate, the distal protrusion protruding from the substrate, the distal protrusion being overlapped with the movable element along the Z axis, the distal protrusion being spaced apart from the swing axis by a second distance along the X axis, the second distance being longer than the first distance; and
   a dummy electrode disposed on an entirety of the distal protrusion, the dummy electrode and the movable element having the same potential,
   wherein, when the movable element swings relative to the substrate around the swing axis, the insulating film on the proximal protrusion and the dummy electrode on the distal protrusion come into contact with the movable element at the same time or the insulating film on the proximal protrusion comes into contact with the movable element and then the dummy electrode on the distal protrusion comes into contact with the movable element,
   the proximal protrusion has a first height along the Z axis, the distal protrusion has a second height along the Z axis, and the first height is larger than the second height, and
   am edge of the mount along the Y axis and the proximal protrustion are aligned along the X axis when viewed along the Z axis.

2. The inertial sensor according to claim 1,
   wherein the proximal protrusion is configured with a plurality of proximal protrusions that are separate from each other along the Y axis.

3. The inertial sensor according to claim 1,
   wherein the distal protrusion is configured with a plurality of distal protrusions that are separate from each other along the Y axis.

4. The inertial sensor according to claim 2,
   wherein the distal protrusion is provided between a first imaginary straight line that intersects one of the proximal protrusions and extends along the X axis when viewed along the Z axis and a second imaginary straight line that intersects another of the proximal protrusions and extends along the X axis when viewed along the Z axis.

5. The inertial sensor according to claim 1,
   wherein, when the insulating film on the proximal protrusion comes into contact with the movable element, a surface of the movable element facing the substrate contracts along the X axis.

6. The inertial sensor according to claim 1,
   wherein the detection electrode is provided on the substrate and overlaps with the movable element when viewed along the Z axis, and
   the dummy electrode is provided on the substrate and overlaps with a region of the movable element that does not overlap with the detection electrode when viewed along the Z axis.

7. The inertial sensor according to claim 1,
   wherein the movable element includes a first movable section and a second movable section that sandwich the swing axis and differ from each other in terms of rotational moment around the swing axis,
   the proximal protrusion is configured with first and second proximal protrusions, and the distal protrusion is configured with first and second distal protrusions,
   the first proximal protrusion and the first distal protrusion overlap with the first movable section when viewed along the Z axis, and
   the second proximal protrusion and the second distal protrusion overlap with the second movable section when viewed along the Z axis.

8. An electronic instrument comprising:
   the inertial sensor according to claim 1; and a control circuit that performs control based on a detection signal outputted from the inertial sensor.

9. A vehicle comprising:
the inertial sensor according to claim 1; and
a control circuit that performs control based on a detection signal outputted from the inertial sensor.

* * * * *